US009201155B2

(12) United States Patent
Leblanc et al.

(10) Patent No.: US 9,201,155 B2
(45) Date of Patent: Dec. 1, 2015

(54) SYSTEMS AND METHODS FOR DOWNHOLE ELECTROMAGNETIC FIELD MEASUREMENT

(71) Applicant: Halliburton Energy Services, Inc., Duncan, OK (US)

(72) Inventors: Michel Joseph Leblanc, Houston, SD (US); Luis E. San Martin, Houston, TX (US); Etienne M. Samson, Cypress, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 268 days.

(21) Appl. No.: 13/915,970

(22) Filed: Jun. 12, 2013

(65) Prior Publication Data

US 2014/0368201 A1   Dec. 18, 2014

(51) Int. Cl.
*G01V 3/10* (2006.01)
*G01V 3/26* (2006.01)

(52) U.S. Cl.
CPC ........................................ *G01V 3/26* (2013.01)

(58) Field of Classification Search
CPC ............. G01V 3/28; G01V 3/38; G01V 3/30; G01B 9/02
See application file for complete search history.

(56) References Cited

U.S. PATENT DOCUMENTS

| | | | |
|---|---|---|---|
| 4,748,415 A * | 5/1988 | Vail, III | 324/339 |
| 4,994,747 A * | 2/1991 | Stolarczyk | 324/334 |
| 5,357,802 A | 10/1994 | Hofmeyer et al. | |
| 5,767,400 A * | 6/1998 | Nakano et al. | 73/152.46 |
| 6,188,223 B1 * | 2/2001 | Van Steenwyk et al. | 324/370 |
| 6,747,743 B2 | 6/2004 | Leblanc | |
| 7,907,277 B2 * | 3/2011 | Csutak | 356/317 |
| 8,432,552 B2 | 4/2013 | Gibler et al. | |

(Continued)

FOREIGN PATENT DOCUMENTS

| | | |
|---|---|---|
| EP | 1972965 | 9/2008 |
| WO | WO-2012/135020 | 10/2012 |
| WO | WO-2014/200573 | 12/2014 |

OTHER PUBLICATIONS

Campanella, Humberto et al., "Comparative performance of static-mode ferrous MEMS gradiometers fabricated by a three-step DRIE process", Journal of Micromechanics and Microengineering, vol. 20 No. 4, (May 21, 2010), 10 pgs.

(Continued)

*Primary Examiner* — Tung X Nguyen
*Assistant Examiner* — Dominic Hawkins
(74) *Attorney, Agent, or Firm* — Krueger Iselin LLP

(57) ABSTRACT

Sensors, systems and methods for downhole electromagnetic field measurement, including a downhole micro-opto-electro-mechanical system (MOEMS) electromagnetic field sensor that includes a first surface that is at least partially reflective, a second surface that is at least partially reflective and suspended by one or more flexible members to define an optical cavity having a variable distance between the first and second surfaces, a first conductive layer attached to the first surface, and a second conductive layer attached to the second surface. The first and second conductive layers have an electrical potential proportional to an electromagnetic field within a formation surrounding the sensor. The electrical potential produces an electric field that displaces the second surface to alter the variable distance and cause a spectrum variation in light exiting the sensor.

20 Claims, 8 Drawing Sheets

(56) References Cited

U.S. PATENT DOCUMENTS

| | | | |
|---|---|---|---|
| 2002/0163639 A1* | 11/2002 | Stephenson | 356/301 |
| 2004/0016295 A1 | 1/2004 | Skinner et al. | |
| 2004/0250614 A1 | 12/2004 | Ander | |
| 2007/0211257 A1* | 9/2007 | Kearl et al. | 356/519 |
| 2008/0271533 A1* | 11/2008 | Csutak | 73/514.27 |
| 2008/0295594 A1 | 12/2008 | Aliod et al. | |
| 2010/0046002 A1 | 2/2010 | Perez et al. | |
| 2010/0286967 A1 | 11/2010 | Vasilevskiy et al. | |
| 2011/0090496 A1 | 4/2011 | Samson et al. | |
| 2011/0141850 A1* | 6/2011 | Scott et al. | 367/50 |
| 2011/0272582 A1* | 11/2011 | Giebeler | 250/339.01 |
| 2012/0018167 A1 | 1/2012 | Konopczynski et al. | |
| 2012/0147381 A1 | 6/2012 | Leblanc et al. | |
| 2012/0232871 A1 | 9/2012 | Priezzhev et al. | |
| 2012/0267730 A1* | 10/2012 | Renard et al. | 257/415 |
| 2013/0056197 A1 | 3/2013 | Maida et al. | |
| 2013/0199776 A1* | 8/2013 | Amir | 166/255.1 |

OTHER PUBLICATIONS

Donderici, Burkay et al., "Fiberoptic Systems and Methods for Formation Monitoring", U.S. Appl. No. 13/736,324, filed Jan. 8, 2013, 21 pgs.

Forstner, Stefan et al., "Sensitivity and Performance of Cavity Optomechanical Field Sensors", Photonic Sensors, vol. 2, No. 3, (2012), pp. 259-270.

Jaaskelainen, Kan-Mikko et al., "Method to Install Sensing Cables in Monitoring Wells", U.S. Appl. No. 13/651,577, filed Oct. 15, 2012, 18 pgs.

Leblanc, Michel J., et al., "Fiberoptic Systems an Methods Detecting EM Signals Via Resistive Heating", U.S. Appl. No. 13/648,897, filed Oct. 10, 2012, 18 pgs.

Maida, John L., et al., "Downhole Species Selective Optical Fiber Sensor Systems and Methods", Maida, John L., et al., "Downhole Species Selective Optical Fiber Sensor Systems and Methods", U.S. Appl. No. 13/253,788, filed Oct. 5, 2011, 23 pgs.

Maida, John L., et al., "Optical Casing Collar Locator Systems and Methods", Maida, John L., et al., "Optical Casing Collar Locator Systems and Methods", U.S. Appl. No. 13/226,578, filed Sep. 7, 2011, 30 pgs.

Maida, John L., et al., "Optical Casing Collar Locator Systems and Methods", U.S. Appl. No. 13/432,206, filed Mar. 28, 2012, 23 pgs.

Mandviwala, Tasneem A., et al., "Distributed Feedback Fiber Laser Strain Sensors Systems and Methods for Subsurface EM Field Monitoring", U.S. Appl. No. 13/756,601, filed Feb. 1, 2013, 23 pgs.

Miao, Houxun et al., "A Microelectromechanically Controlled Cavity Optomechanical Sensing System", Center for Nanoscale Science and Technology, National Institute of Standards and Technology, Gaithersburg, MD, 26 pgs.

Samson, Etienne M., et al., "Downhole Systems and Methods for Water Source Determination", Samson, Etienne M., Downhole Systems and Methods for Water Source Determination, U.S. Appl. No. 13/418,455, filed Mar. 13, 2012, 27 pgs.

Samson, Etienne M., et al., "Downhole Treatment Monitoring Systems and Methods Using Ion Selective Fiber Sensors", "Downhole Treatment Monitoring Systems and Methods Using Ion Selective Fiber Sensors", U.S. Appl. No. 13/717,979, filed Dec. 18, 2012, 23 pgs.

Samson, Etienne M., et al., "Remote Sensing Methods and Systems Using Nonlinear Light Conversion and Sense Signal Transformation", U.S. Appl. No. 13/726,041, filed Dec. 22, 2012, 42 pgs.

Samson, Etienne M., et al., "Remote Work Methods and Systems Using Nonlinear Light Conversion", "Remote Work Methods and Systems Using Nonlinear Light Conversion", U.S. Appl. No. 13/722,623, filed Dec. 20, 2021, 24 pgs.

Samson, Etienne M., et al., "Systems and Methods for Downhole Magnetic Field Measurement", filed concurrently herewith, 38 pgs.

San Martin, Luis E., et al., "Fiberoptic Systems and Methods for Subsurface EM Field Monitoring", U.S. Appl. No. 13/736,487, filed Jan. 8, 2013, 19 pgs.

San Martin, Luis E., et al., "Systems and Methods for Downhole Electric Field Measurement", filed concurrently herewith, 38 pgs.

Skinner, Neal G., et al., "Downhole Time Domain Reflectometry with Optical Components", Skinner, Neal G., et al., "Downhole Time Domain Reflectometry with Optical Components", U.S. Appl. No. 13/655,607, filed Oct. 19, 2012, 32 pgs.

Tien, Ming-Chun et al., "Tunable MEMS Actuated Microring Resonators", WD5 16:45-17:00, Berkeley Sensor & Actuator Center and Dept. Electrical Engineering and Computer Sciences, Berkeley, CA, 2 pgs.

"Optical Frequency Combs", The National Institute of Standards and Technology, http://www.nist.gov/public_affairs/releases/frequency_combs.cfm, (Mar. 13, 2006), 3 pgs.

Chou, C.W. et al., "Frequency Comparison of Two High-Accuracy Al þ Optical Clocks", Physical Review Letters 104, 070802, (2010), 4 pgs.

Chou, C.W. et al., "Optical Clocks and Relativity", Science, 329, (2010), pp. 1630-1633.

Guinot, B. "Application of general relativity to metrology", Metrologia 34, (1997), pp. 261-290.

Leblanc, Michael et al., "Systems and Methods for Downhole Electromagnetic Field Measurement", Appl No. PCT/US2014/014882, "Systems and Methods for Downhole Electromagnetic Field Measurement," filed Feb. 5, 2014, 35 pgs.

Le Targat, L. et al., "Corrigendum: Experimental realization of an optical second with strontium lattice clocks", Nature Communications, 4, Article No. 2109, (2013), 1 pg.

Nagano, Shigeo et al., "Stable Operation of Femtosecond Laser Frequency Combs with Uncertainty at the 1017 Level toward Optical Frequency Standards", Japanese Journal of Applied Physics, 48, 042301, (2009), 8 pgs.

Predehl, K. et al., "A 920-Kilometer Optical Fiber Link for Frequency Metrology at the 19th Decimal Place", Science, 336, (2012), pp. 441-444.

San Martin, Luis E., et al., PCT Appl No. PCT/US2014/044151, "Optically Obtaining Gravitational Field Measurements in a Downhole or Subsea Environment," Filed Jun. 25, 2014, 32 pgs.

San Martin, Luis et al., "Systems and Methods for Downhole Electric Field Measurement", Appl No. PCT/US2014/014884, "Systems and Methods for Downhole Electric Field Measurement," filed Feb. 5, 2014, 36 pgs.

"PCT Search Report and Written Opinion", Dated May 23, 2014, Appl No. PCT/US2014/014882, "Systems and Methods for Downhole Electromagnetic Field Measurement," filed Feb. 5, 2014, 20 pgs.

"PCT International Search Report and Written Opinion", Dated Mar. 30, 2015, Appl No. PCT/US2014/044151, "Optically Obtaining Gravitational Field Measurements in a Downhole or Subsea Environment," Date Filed Jun. 25, 2014, 17 pgs.

Hinkley, N. et al., "An Atomic Clock with 10-18 Instability", Science, 341, (2013), pp. 1215-1218.

* cited by examiner

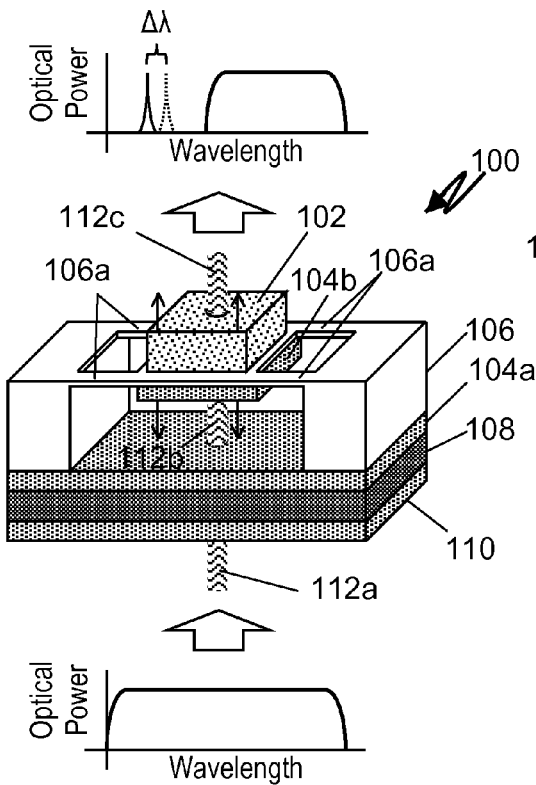
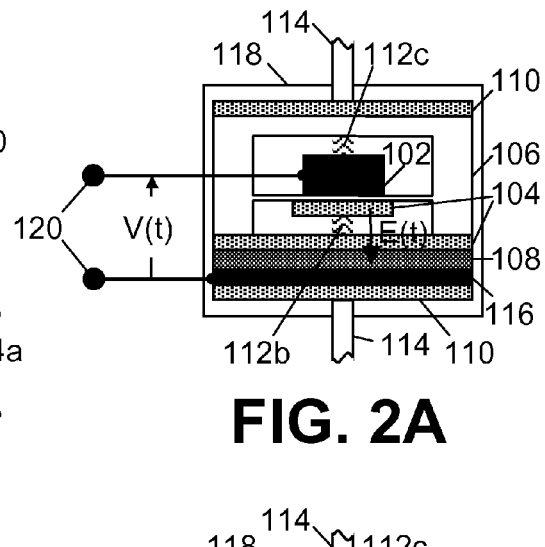
FIG. 2A
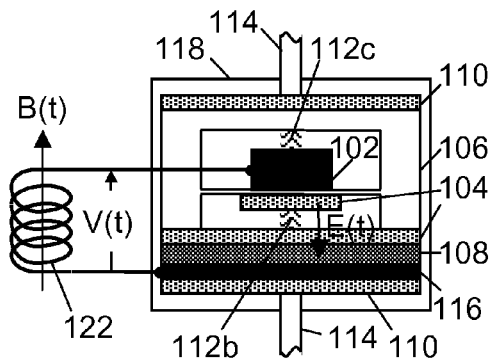
FIG. 2B
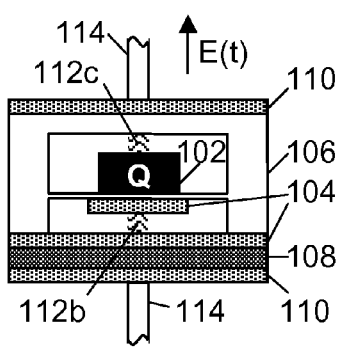
FIG. 3A
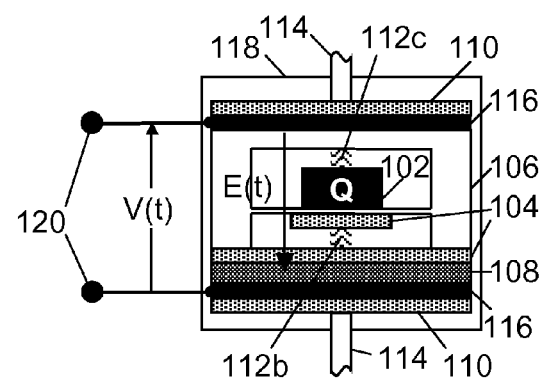
FIG. 3B
FIG. 1

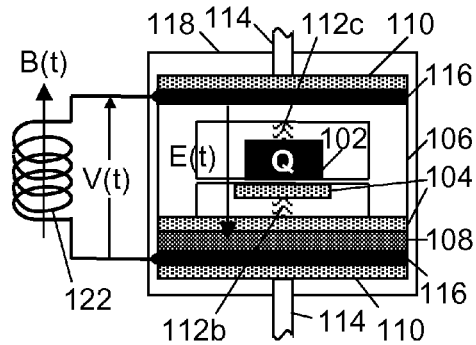
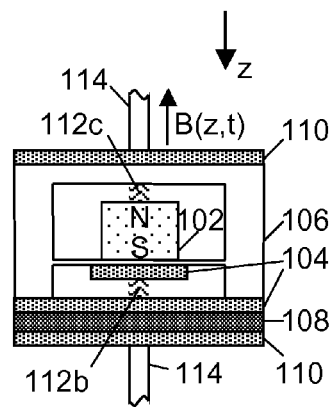
FIG. 3C  FIG. 4A
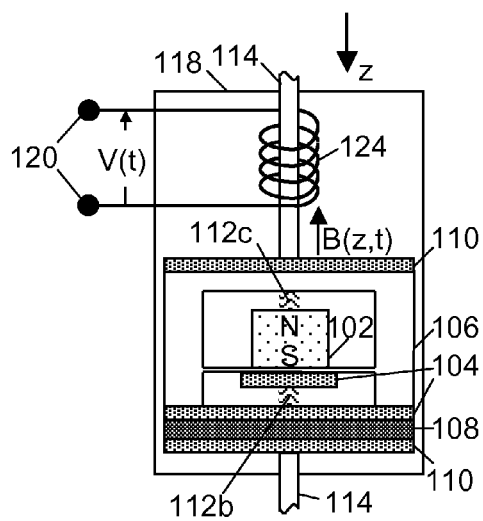
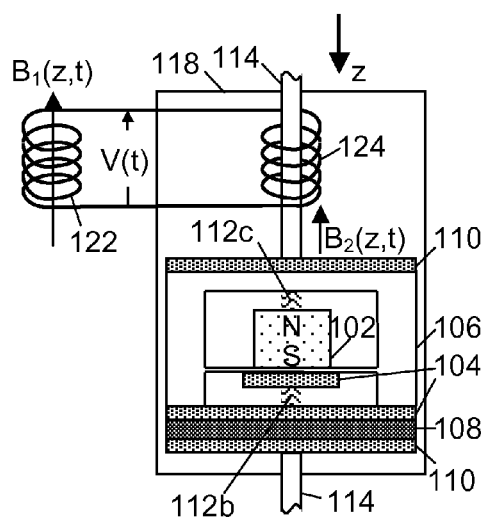
FIG. 4B  FIG. 4C

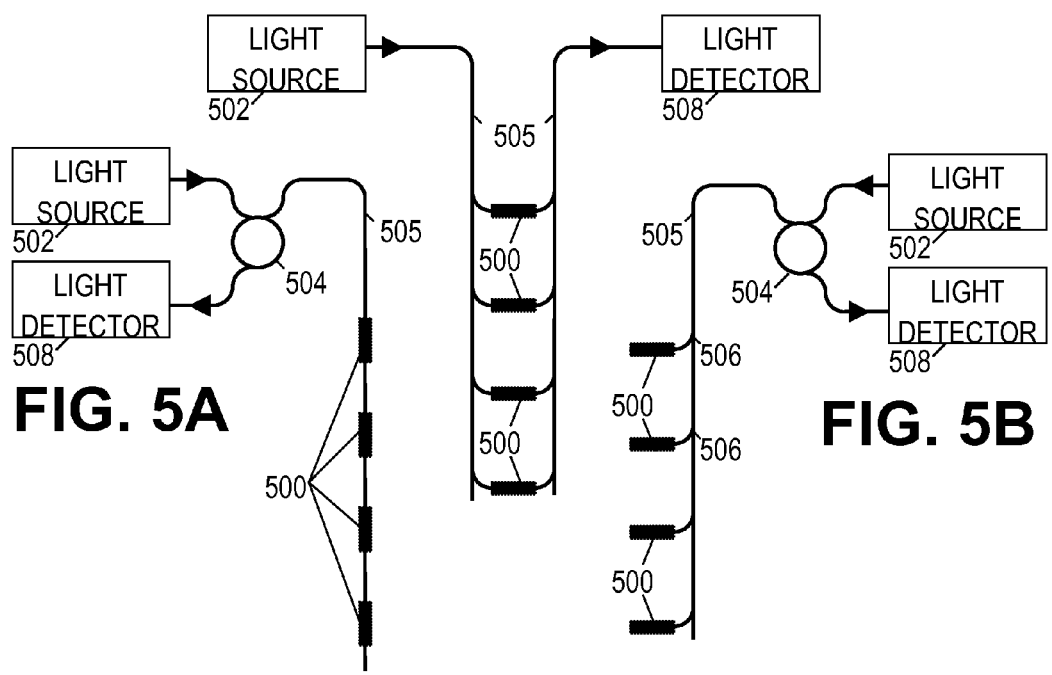
FIG. 5C
FIG. 5A
FIG. 5B
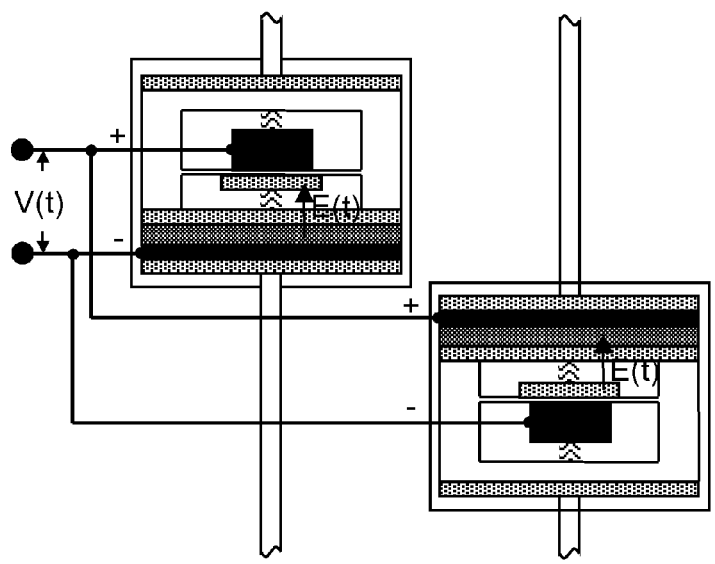
FIG. 6A

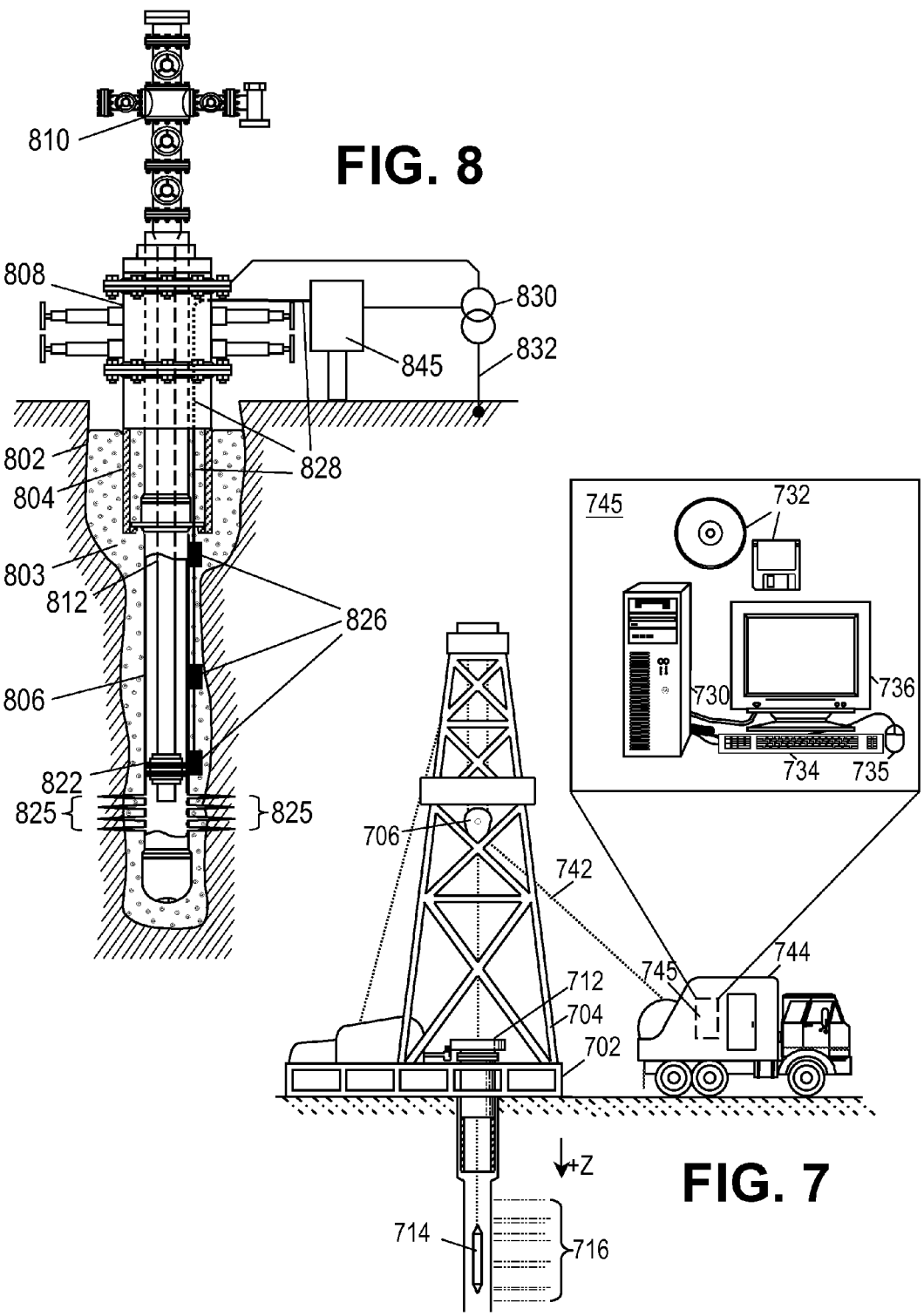

SYSTEMS AND METHODS FOR DOWNHOLE ELECTROMAGNETIC FIELD MEASUREMENT

CROSS-REFERENCE TO RELATED APPLICATIONS

This application is related to U.S. patent application Ser. No. 13/916,007, titled "Systems and Methods for Downhole Electric Field Detection" and filed Jun. 12, 2013 by L. E. San Martin, M. J. LeBlanc and E. Samson, and U.S. application Ser. No. 13/916,028, titled "Systems and Methods for Downhole Magnetic Field Detection" and filed Jun. 12, 2013 by E. Samson, M. J. LeBlanc and L. E. San Martin, which are both hereby incorporated herein by reference and filed concurrently.

BACKGROUND

Modern petroleum drilling and production operations demand a great quantity of information relating to the parameters and conditions downhole. Such information typically includes the location and orientation of the borehole and drilling assembly, earth formation properties, and parameters of the downhole drilling environment. The collection of information relating to formation properties and downhole conditions is commonly referred to as "logging," and can be performed using wireline logging tools or during the drilling process itself (hence the term "logging while drilling" or "LWD," frequently used interchangeably with the term "measurement while drilling" or "MWD"). Information may also be collected using sensors embedded within the cement that secures the casing of a completed well to a borehole.

Because of the harsh environment present downhole, it can be challenging to design logging sensors and tools that operate reliably for extended periods of time within a borehole. This is particularly true for tools that include active electronic components to measure, amplify, sample and process signals present in the surrounding formation. Failures of such components can result in expensive delays in drilling (in the LWD case) or delays in logging (in the wireline logging case) while a tool is repaired or replaced, or in a reduction in monitoring capabilities for completed wells where the sensors generally cannot be accessed to be repaired or replaced. Increasing the reliability of logging tools and sensors is thus highly desirable.

BRIEF DESCRIPTION OF THE DRAWINGS

A better understanding of the various disclosed embodiments can be obtained when the following detailed description is considered in conjunction with the attached drawings, in which:

FIG. 1 shows an illustrative micro-opto-electro-mechanical systems (MOEMS) sensor for measuring electromagnetic fields within a formation.

FIG. 2A shows an illustrative MOEMS sensor for measuring an electric field within a formation.

FIG. 2B shows an illustrative MOEMS sensor for measuring a varying magnetic field within a formation.

FIGS. 3A and 3B show illustrative MOEMS sensors for measuring electric fields within a formation.

FIG. 3C shows an illustrative MOEMS sensor for measuring a varying magnetic field within a formation.

FIG. 4A shows an illustrative MOEMS sensor for measuring a magnetic field gradient within a formation.

FIG. 4B shows an illustrative MOEMS sensor for measuring an electric field within a formation.

FIG. 4C shows an illustrative MOEMS sensor for measuring a varying magnetic field within a formation.

FIGS. 5A through 5C show illustrative MOEMS sensor array configurations.

FIG. 7 shows an example of a drilling environment suitable for use of a wireline well logging tool incorporating the disclosed MOEMS sensors.

FIG. 8 shows an illustrative completed well that includes the disclosed MOEMS sensors.

Figure 6B:
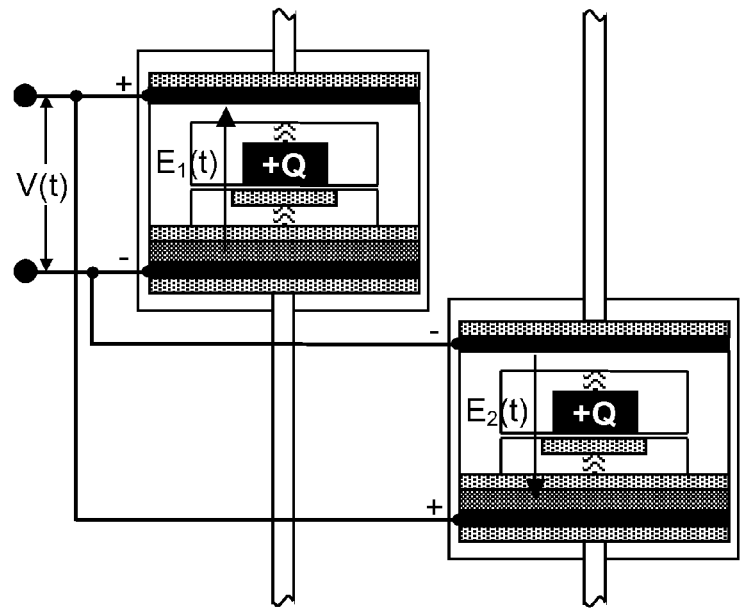
FIGS. 6A and 6E show illustrative vibrational noise configurations of the disclosed MOEMS sensors.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

The paragraphs that follow describe illustrative sensors, systems and methods for downhole electromagnetic, electric and/or magnetic field measurements. An illustrative sensor that induces frequency spectrum variations to a light beam that are indicative of an imposed electric or magnetic field is first described, followed by descriptions of embodiments directed to each type of field using varying sensing methods. Various illustrative sensor array configurations are then described, followed by illustrative combinations of sensors to cancel out vibrational noise that may be present. An illustrative completed well and an illustrative drilling environment suitable for using the disclosed sensors, sensor systems and methods are both also described. Further, an illustrative computer-based system is described, together with an illustrative method for calculating formation resistivity, permittivity and/or permeability using the disclosed sensors that can be implemented by the computer-based system.

While the present disclosure covers a number of different micro-opto-electro-mechanical system (MOEMS) sensor embodiments, the underlying principle for operation of each sensor is similar, as shown in illustrative MOEMS sensor 100 of FIG. 1. The illustrative MOEMS sensor is built upon a substrate 108, which may include transparent materials such as silicon, which is transparent to near-infrared light, or an opening or other optical path that permits a light beam 112 to traverse the sensor, entering the sensor as light beam 112a, passing through the optical cavity of the sensor as light beam 112b, and exiting the optical cavity as light beam 112c. Substrate 108 is covered on one side by a layer 104a to create a surface that is reflective over a portion of the light spectrum, and on the other side by an antireflection layer 110. A support structure 106 attaches to (or is integral with) substrate 108 and suspends an opposing movable layer 104b (which also has a reflective surface) and a field sensitive element 102 using four flexible members or "beams" 106a.

Reflective surfaces 104a and 104b form a Fabry-Perot cavity with a free spectral range (FSR) dependent upon the spacing d between the layers. As illustrated in the transmission spectrum at the top of FIG. 1, however, layers 104a and 104b are designed so as to be reflective over a range of wavelength smaller than the FSR so that a single transmission peak is produced. Outside of the range of the reflectivity range of the surfaces, a high transmission is present, which allows for multiplexing of several sensors in series by using different wavelength bands for each sensor. This multiplexing approach is disclosed in U.S. Pat. No. 8,334,984, which is hereby incorporated by reference. Support structure 106, like substrate 108, may be formed using either a transparent material or a non-transparent material with an opening or other optical path that enables passage of light beam 112. Field sensitive element 102 also has an opening (or other optical path) that enables passage of light beam 112.

Beams 106a are formed from a resilient, flexible material that enables an electric or magnetic field (depending on the compositions of field sensitive element 102) to displace the movable layer 104b along a translational axis parallel to the beam of light (as indicated by the upward and downward facing arrows). In the embodiment shown, the beams 106a provide a restoring force that returns the movable layer 104b to a neutral position in the absence of forces imposed on the field sensitive element 102, and also constrain the movement of movable layer 104b and field sensitive element 102 to a path along the aforementioned translational axis (i.e., perpendicular to the top surface of support structure 106). The displacement of layer 104b varies an optical passband of the optical cavity by changing the distance between the two partially reflective surfaces (layer 104a and moveable layer 104b). For a time-variant electromagnetic field, the movement produces a corresponding time-variance in the wavelength of that portion of the light spectrum affected by the optical cavity. The resulting optical spectrum or wavelength variation $\Delta\lambda$ shown in FIG. 1 is directly related to the peak-to-peak magnitude of the measured field. (To a first order approximation, the wavelength variation is proportional to the field amplitude.) These wavelength shifts can be measured using an unbalanced interferometer, in the same way as is used to interrogate Fiber Bragg Gratings (see, e.g., A. D. Kersey, T. A. Berkoff, and W. W. Morey, "High resolution fiber Bragg grating based strain sensor with interferometric wavelength shift detection," Electron. Lett., vol. 28, p. 236, 1992). Detection levels as low as 1 fm/$\sqrt{Hz}$ are possible with this approach. As described later in this document, this will permit detection of electric field variations down to the μV level and changes in magnetic field gradients in the 10's of picotesla per meter. The optical wavelength variations may be measured using, for example, interferometric demodulation techniques. Many other techniques suitable for detecting the optical wavelength variations of the disclosed sensors will become apparent to those of ordinary skill in the art, and all such techniques are within the scope of the present disclosure.

In at least some illustrative embodiments, the source of the light entering the optical cavity is preferably a wideband light source as shown in FIG. 1. In the example shown, light wavelengths immediately above and below a passband wavelength of the optical cavity are blocked by destructive interference, but light at the passband frequency and sufficiently above or below the passband propagate through the optical cavity. In the example shown in FIG. 1, a significant portion of the light with a wavelength above one of the optical cavity's passband wavelengths propagates through the cavity with little or no attenuation. This unattenuated portion of the propagated light's bandwidth is available for use by other optical cavities tuned to different passband wavelengths coupled in series along a single fiber. The optical cavities operate to together produce a wavelength multiplexed optical signal.

The basic sensor design described above as well as the illustrative embodiments described below are all suitable for use within tools and systems used to acquire downhole formation data such as LWD/MWD tools, wireline logging tools/systems, production logging tools/systems and reservoir monitoring and management systems. Depending upon the type of field detection desired, different materials may be used for field sensitive element 102, and different structures may be used to generate electric and magnetic fields that are proportional to the surrounding electromagnetic field. In at least some illustrative sensor embodiments, the electromagnetic field induces a secondary field that is proportional to the electromagnetic field, and a measurement of this secondary field is used to derive measurements of the electromagnetic field.

The mechanical response of the various devices described in this document can be analyzed by considering the illustrative MOEMS sensor of FIG. 1. Let m be the effective mass of the field sensitive element 102 and let k be the effective spring constant of beams 106a. Let us first assume the device to be mounted is on an inertial frame such that substrate 108 can be considered at rest and horizontal relative to the local gravity vector g. Let Y be a coordinate describing the vertical position of field sensitive element 102. From Newton's second law we have:

$$m\ddot{Y}=-mg-k(Y-Y_0)-c\dot{Y}+F_{EM} \quad (1)$$

where $Y_0$ is the null position for the flexures, and where c is a viscous damping coefficient for the motion due to the contribution of the air friction around field sensitive element 102 or due to viscous response of the beams 106a which can be enhanced by the deposition of a polymeric material, and where $F_{EM}$ is caused on field sensitive element 102 by the electromagnetic force. We can always choose the origin of our coordinate system so that at Y=0 we have $-mg+kY_0=0$, so the equation of motion of the device can be written:

$$\ddot{Y} + 2\zeta\omega_0\dot{Y} + \omega_0^2 Y = \frac{F_{EM}}{m} \quad (2)$$

where $\zeta=c/2\sqrt{km}$ and is the damping ratio (equal to 1 for critical damping); and $\omega_0=\sqrt{k/m}$ and is the resonance frequency of the mass-spring system. The analysis therefore resides in the determination of $F_{EM}$ for the various devices and, for the cases where $F_{EM}$ depends on the position Y, the form of equation (2) gets modified accordingly.

FIG. 2A illustrates an example of a MOEMS sensor that implements such an indirect measurement of the electric field. In the embodiment shown, field sensitive element 102 is implemented as an electrically conductive layer (e.g., copper, aluminum or polysilicon), with a second electrically conductive layer 116 being attached to the substrate 108 on the opposite side of the cavity (e.g., between substrate 108 and the lower antireflection layer 110). The electrically conductive layers are either formed from transparent materials (e.g., Indium Tin Oxide) or equipped with openings or windows to permit light transmission. In at least some illustrative embodiments, enclosure 118 surrounds the sensor and provides attachment points for optical waveguides 114 (e.g., optical fibers).

Field sensitive element 102 and electrically conductive layer 116 are each electrically coupled to one of two electrodes 120 external to the MOEMS sensor. The electrodes 120 each contact different points of the formation surrounding the sensor. As a result, any electrical potential induced by electromagnetic fields within the surrounding formation are applied across element 102 and layer 116, which act like the plates of a parallel plate capacitor between which an electric field E(t) is induced. In at least some embodiments an electrically conductive enclosure 118 surrounds and shields the sensor from external electric fields such that the direct effect of these fields on the movement of field sensitive element 102 and attached moveable layer 104 is negligible.

Using a parallel plate capacitor approximation, the force on field sensitive element 102 is given by:

$$F_{EM} = \frac{-\varepsilon_0 A V^2}{2d^2} \quad (3)$$

where $\varepsilon_0 \approx 8.854 \times 10^{-12}$ F/m is the free space permittivity, A is the area of the plate, and d is the distance between the plates (i.e., the distance between element 102 and layer 116), and where V is the voltage created by the remote field across electrodes 120. Let us write $d=d_0+Y$ so that we have, assuming Y is small:

$$F_{EM} \approx \frac{-\varepsilon_0 A V^2}{2d_0^2}\left(1 - 2\frac{Y}{d_0}\right) \quad (4)$$

Assuming $Y \ll d_0$ the equation of motion becomes:

$$\ddot{Y} + 2\omega_0 \dot{Y} + \omega_0^2 Y = \frac{-\varepsilon_0 A V^2}{2md_0^2} \quad (5)$$

If we assume a signal of the form, $$V(t) = V_0 \sin(\omega t)[V(t)]^2 = V_0^2 \sin^2(\omega t) = \frac{V_0^2}{2}(1 - \cos(2\omega t), \quad (6)$$

the equation of motion becomes:

$$\ddot{Y} + 2\omega_0 \dot{Y} + \omega_0^2 Y = \frac{-\varepsilon_0 A V_0^2}{4md_0^2}(1 - \cos 2\omega t) \quad (7)$$

Writing $Y' = Y - Y_\Delta$ with $Y_\Delta = \frac{-\varepsilon_0 A V_0^2}{4md_0^2}$ gives, $$\ddot{Y}' + 2\omega_0 \dot{Y}' + \omega_0^2 Y' = \frac{\varepsilon_0 A V_0^2}{4md_0^2}(\cos 2\omega t). \quad (8)$$

Solutions are given by:

$$Y' = Re[D(\omega)e^{i2\omega t}] \quad (9)$$

where D (ω) (a complex number with both magnitude and phase) can be found by replacing the solution into equation (7). The expression for D(ω) is:

$$D(\omega) = \frac{\varepsilon_0 A V_0^2}{4md_0^2} \frac{[(\omega_0^2 - (2\omega)^2) - j(2\omega_0(2\omega))]}{(\omega_0^2 - (2\omega)^2)^2 + (2\omega_0(2\omega))^2} \quad (10)$$

For a Fabry-Perot cavity, the center wavelength of transmission peaks shifts with a change in cavity length following the relation (/)=(d/d). In our case, the amplitude of the oscillating portion of d is the same as the amplitude of Y' so the amplitude of the wavelength shift will be obtained as:

$$|(\omega)| = \frac{|D(\omega)|}{d_0} = \frac{\varepsilon_0 A V_0^2}{4md_0^3}\frac{1}{\sqrt{(\omega_0^2 - (2\omega)^2)^2 + (2\omega_0(2\omega))^2}} \quad (11)$$

By way of a numerical example, consider a mass of m=0.81 μg, a spring constant of 6.34 N/m, and an area $6.24 \times 10^{-6}$ m². This results in a resonant angular frequency of $\omega_0 = 88.5 \times 10^3$ rad/s (or f=14.1 kHz). (Because the response is to the square of the applied voltage, the resonant condition for the signal is at half that frequency.) Further, for =1550 nm, $d_0=60$ μm, the result is a low frequency amplitude of $|(\omega \to 0)|=15.7$ pm/volt²-×$V_0^2$. For detected wavelength shift amplitudes of 1 fm, this corresponds to a voltage amplitude of 8.0 mV. The measurement of the sensor provides a solution for Y', from which the value of the voltage can be determined.

The above-described analysis is performed using a parallel plate approximation, which is qualitatively correct. In other illustrative embodiments, the relationship between the movement of movable layer 104 and the measured field is derived by means of calibrated measurements performed using a known electromagnetic field.

In order to increase the sensitivity and to make the response proportional to the applied signal rather than its square, a bias voltage can be applied. This produces a signal of the form $V(t)=V_0+V(t)$ and changes the equation of motion to $$\ddot{Y}'' + 2'\omega_0' \dot{Y}'' + \omega_0'^2 Y'' = \frac{-\varepsilon_0 A[V(t)]^2}{md_0^2} \quad (12)$$

where $\omega'_0 = \sqrt{k'/m}$, $$' = c/\left(2\sqrt{k'm}\right) \text{ and } k' = k - \frac{\varepsilon_0 A V_0^2}{d_0^2}.$$

In this case, the amplitude of the wavelength shift, for $V(t)=V_0+V_0 \sin(\omega t)$ and based on motion described as $Y''=Re[D'(\omega)e^{i\omega t}]$ is obtained as:

$$|(\omega)| = \frac{|D'(\omega)|}{d_0} = \frac{\varepsilon_0 A V_0 V_0}{md_0^3}\frac{1}{\sqrt{(\omega_0'^2 - \omega^2)^2 + (2\omega_0'\omega)^2}}. \quad (13)$$

Using the same parameters as the previous numerical example, but with $V_0=10$ volts, we get a low frequency amplitude of 632 pm/volt×$V_0$. For detectable wavelength shift amplitudes of 1 fm, this corresponds to a voltage amplitude of $V_0=1.6$ μV. (Note that the sensitivity scales are in proportion to the applied bias voltage $V_0$.)

As already noted, the above relationships presume that the applied potential difference V is static or varies slowly, where slowly is understood to mean that changes in the potential difference occur at a slower rate than the natural time constant associated with the charging of the parallel plate capacitor formed by element 102 and layer 116 (e.g., at a rate at least 10 times slower). This time constant is known to be R*C, where R is the resistance of the wire coupling each of element 102 and layer 116 to the source of the potential difference (e.g., the formation in the example of FIG. 2A). Using a parallel plate approximation of $C=(\epsilon_0 A/d)$ for the illustrative embodiment of FIG. 2A, the capacitance of the sensor is in the order of 1 picofarad. With wires having a resistance of 1 Ohm and providing a negligible contribution to the overall capacitance of the sensor, the resulting time constant is in the order of $10^{-12}$ seconds. Thus, even for electrical potentials produced by time-variant electromagnetic fields in the gigahertz range, $Q=C*V$ may be used to approximate the charge present on element 102 and layer 116.

Once the electrical potential present at electrodes 120 is known, the electric or magnetic properties being measured, such as electric resistivity, electric permittivity and/or magnetic permeability and corresponding composition of the surrounding formation can be derived using any of a wide variety of known techniques, given a known transmitted excitation signal. In at least some illustrative embodiments, a large resistor (e.g., greater than 1M Ohm) couples element 102 and layer 116 to each other to prevent the accumulation of a static charge that could introduce an electrical offset potential.

A variation of the MOEMS sensor of FIG. 2A is shown in FIG. 2B in which the electrical potential V(t) applied to element 102 and layer 116 is provided by an induction pick-up coil 122. The electrical potential is induced across induction coil 122 by the magnetic field component B(t) of the electromagnetic field present in the surrounding formation. The derivation of the electrical potential from the optical wavelength variations of the light beam exiting the MOEMS sensor is as described above for the embodiment of FIG. 2A. From the electrical potential V(t) the magnetic field B(t) can be determined from a second order differential equation with two parameters: the attenuation $\alpha=R/(2*L)$ and the resonance frequency $\omega_0=1/(L*C)^{1/2}$, where R is the resistance of the wires connecting the induction coil 122 to element 102 and layer 116, and L is the inductance of the induction coil. This equation corresponds to a series R-L-C network and is represented as:

$$\frac{d^2 i}{dt} + \frac{R}{L} * \frac{di}{dt} + \frac{i}{(L*C)} = C * \sin(\omega * t) \quad (14)$$

Equation (14) can be re-written as:

$$\frac{d^2 i}{dt} + 2 * \alpha * \frac{di}{dt} + \omega_0^2 * i = C * \sin(\omega * t) \quad (15)$$

Here the right hand side represents the excitation generated by the voltage induced in the induction coil. Once electric potential V(t) on the capacitor is determined as described above, the current in the capacitor can be found (I=C*dV/dt). This current is equal to the current in the induction coil and in the resistor, as the three circuit elements are connected in series. From the induction coil current the induction coil voltage can be determined (V=L*dI/dt), and from there the B field that generated the voltage is obtained. Once the magnetic field around induction coil 122 is known, the electric or magnetic properties being measured, such as electric resistivity, electric permittivity and/or magnetic permeability and corresponding composition of the surrounding formation can be derived using any of a wide variety of know techniques, given a known transmitted excitation signal.

In at least some illustrative embodiments, field sensitive element 102 is exposed to an electric field. An electric charge Q stored on field sensitive element 102 causes it to move in response to the electric field. FIG. 3A shows an illustrative embodiment, wherein the MOEMS sensor does not include an enclosure (such as enclosure 118 of FIG. 2A) and is thus exposed to the electric field component E(t) of the electromagnetic field present in the formation. The charge present on field sensitive element 102 may be generated at the surface before deploying a tool incorporating the sensor into a borehole. A high-voltage source, for example, may be coupled to the MOEMS sensor through otherwise isolated charging leads to induce and/or deposit the charge Q onto field sensitive element 102.

Once field sensitive element 102 is charged to a desired level, the MOEMS sensor of FIG. 3A operates in a similar manner as that described above for FIGS. 2A and 2B. The amount of charge Q that can be stored within element 102 can range from approximately $10^{-10}$ to $10^{-7}$ Coulombs, depending upon the mechanism used to charge element 102. Equation (1) also describes the equilibrium of forces operating within the MOEMS sensor of FIG. 3A, but wherein the equilibrium condition is described as $F_{EM}=Q \cdot E(t)$. Once the electric field is known, the electric or magnetic properties being measured, such as electric resistivity, electric permittivity and/or magnetic permeability and corresponding composition of the surrounding formation can be derived using any of a wide variety of known techniques, given a known transmitted excitation signal.

Because a static charge on an isolated conductor will tend to distribute itself along the edges of the conductor (due to the mutual repulsion of like charged particles), at least some illustrative embodiments subdivide field sensitive element 102 into multiple sections such that at least some of the edges of each section are closer to a midpoint between beams 106a. For example, two side-by-side rectangles may be used, each with an edge near the midpoint. Other geometries suitable for increasing the charge present at the midpoint will become apparent to those of ordinary skill in the art, and all such geometries are within the scope of the present disclosure. The use of multiple sections may thus increase the amount of deflection of beams 106a for a given induced electric field force by increasing the leveraging effect of the force on beams 106a, increasing the sensitivity of the MOEMS sensor relative to a single-section element 102.

An alternative embodiment to the MOEMS sensor of FIG. 3A is shown in FIG. 3B in which the electric field E(t) to which the sensor is exposed is generated by an electrical potential applied across electrically conductive layers 116, positioned to either side of field sensitive element 102. Electrically conductive layers 116 are each electrically coupled to one of two electrodes 120 external to the MOEMS sensor by wires that are insulated from the formation. The electrodes 120 each contact different points of the formation surrounding the sensor. As a result, any electrical potential induced by electromagnetic fields within the surrounding formation are applied across layers 116, which act like the plates of a parallel plate capacitor between which the electric field E(t) is induced. The derivation of the electric field E(t) from the optical wavelength variations is achieved in the same manner as described for the MOEMS sensor of FIG. 3A, and the electrical potential applied across the two electrically conductive layers 116 is known to be V(t)=E(t)*d, where d is the distance between the layers. Once the electrical potential present at electrodes 120 is known, the electric or magnetic properties being measured, such as electric resistivity, electric permittivity and/or magnetic permeability and corresponding composition of the surrounding formation can be derived using any of a wide variety of known techniques, given a known transmitted excitation signal. In at least some illustrative embodiments, a large resistor (e.g., greater than 1M Ohm) couples layers 116 to each other to prevent the accumulation of a static charge that could introduce an electrical offset potential.

In at least some illustrative embodiments an electrically conductive enclosure 118 as shown in FIG. 3B surrounds and shields the sensor from external electric fields such that the direct effect of these fields on the movement of field sensitive element 102 and attached moveable layer 104 is negligible. In other illustrative embodiments, the magnitude of the electric field E(t) present within the MOEMS sensor is significantly larger than the electric field component of the electromagnetic field present in the formation (e.g., greater by at least a factor of 10), such that the effect of the formation's electric field on the MOEMS sensor is negligible. This difference in field magnitude is at least in part due to the fact that the electrical potential within the formation is measured across the distance between electrodes 120 (typically several meters), whereas the same electrical potential when applied to the MOEMS sensor is across the much shorter distance between electrically conductive layers 116 (typically less than 1 mm).

A variation of the MOEMS sensor of FIG. 3B (similar to that of FIG. 2B) is shown in FIG. 3C in which the electrical potential V(t) applied to electrically conductive layers 116 is provided by an induction coil 122. The electrical potential is induced across induction coil 122 by the magnetic field component B(t) of the electromagnetic field present in the surrounding formation. The determination of the electrical potential V(t) across the layers 116 from the optical wavelength variations is achieved in the same manner as for the embodiment of FIG. 3A, and the magnetic field B(t) is determined from the electrical potential V(t) in the same manner as for the embodiment of FIG. 2B. Once the magnetic field around induction coil 122 is known, the electric or magnetic properties being measured, such as electric resistivity, electric permittivity and/or magnetic permeability and corresponding composition of the surrounding formation can be derived using any of a wide variety of know techniques, given a known transmitted excitation signal.

The illustrative MOEMS sensors shown in FIGS. 2A-3C represent variations of the MOEMS sensor of FIG. 1 that each operates to measure an electric field that passes through the sensor. Other variations may operate to measure magnetic field gradients, and FIGS. 4A-4C show examples of such variations. The illustrative MOEMS sensor embodiment of FIG. 4A, for example, uses a polarized magnetic layer as field sensitive element 102 (e.g., a permanent magnet with North and South poles "N" and "S"). Field sensitive element 102 reacts to a gradient in the magnetic field B(z,t) surrounding the MOEMS sensor in the same way as the field sensitive element 102 of the MOEMS sensors of FIGS. 2A-3C react to an electric field, and produces similar optical wavelength variations in the light beam 112c exiting the sensor of FIG. 4A. In at least some illustrative embodiment, the magnetic field B(z,t) is the magnetic field component of an electromagnetic field present in a formation surrounding the MOEMS sensor.

For the MOEMS sensor of FIG. 4A, the force exerted on field sensitive element 102 is represented by $$F_{EM} = m_{mag} \cdot \frac{dB}{dz},$$

wherein $m_{mag}$ is the vertical component of the magnetic moment of field sensitive element 102 and the magnetic field B is a function of both borehole depth z and time t, where the z-coordinate is along an axis of the sensor coinciding with the translation direction of movable layer 104. Equation (2) is applied to determine the magnetic field gradient as previously described. For example, assuming the same parameters as in the previous numerical example, and a magnetic moment of $6.8 \times 10^{-3}$ amp·m², a detectable wavelength shift amplitude of 1 fm corresponds to a change in magnetic field gradient of 36 pT/m. Once the magnetic field gradient of B(z,t) is known, the electric or magnetic properties being measured, such as electric resistivity, electric permittivity and/or magnetic permeability and corresponding composition of the surrounding formation can be derived using any of a wide variety of known techniques, given a known transmitted excitation signal.

An alternative embodiment to the MOEMS sensor of FIG. 4A is shown in FIG. 4B, in which the magnetic field B(z,t) to which the sensor is exposed is generated by an electrical potential applied across an induction coil 124 positioned above and along the translational axis of field sensitive element 102. In the embodiment shown, the magnetic axis of the induction coil 124 is preferably oriented to be parallel to the magnetic axis of field sensitive element 102, with both magnetic axes also being preferably parallel to the translational axis of field sensitive element 102. Nonetheless, other orientations of induction coil 124 and field sensitive element 102 are contemplated and are within the scope of the present disclosure. Induction coil 124 is electrically coupled to two electrodes 120 external to the MOEMS sensor. The electrodes 120 each contact different points of the formation surrounding the sensor. As a result, any electrical potential induced by electromagnetic fields within the surrounding formation is applied across induction coil 124. After solving for the gradient of B(z,t), the field B(z,t) can be determined with an appropriate calibration of the sensor.

Once the magnetic field B(z,t) produced by induction coil 124 is known, the current following through the induction coil, and thus the associated electrical potential across the induction coil, can be determined. The current flowing through the induction coil is derived using the approximate expression of the induction coil's magnetic field $$B(z, t) = \frac{\left(\frac{\mu_0}{8\pi}\right) * (I(t) * R)}{(R^2 + z^2)^{3/2}},$$

where R is the radius of induction coil 124, I is the current through the induction coil and z is the distance along the induction coil's axis from the center of the induction coil to the point where the magnetic field is measured. The applied electrical potential may then be calculated using Ohm's law. In at least some illustrative embodiments, the MOEMS sensor is calibrated by measuring the dependence between the current in the induction coil and the force exerted on field sensitive element 102. Once the electrical potential applied to induction coil 124 and present at electrodes 120 is known, the electric or magnetic properties being measured, such as electric resistivity, electric permittivity and/or magnetic permeability and corresponding composition of the surrounding formation can be derived using any of a wide variety of known techniques, given a known transmitted excitation signal.

In at least some illustrative embodiments a magnetically permeable enclosure 118 as shown in FIG. 4B surrounds and shields the sensor from external magnetic fields such that the direct effect of these fields on the movement of field sensitive element 102 and attached moveable layer 104 is negligible. In other illustrative embodiments, the magnitude of the magnetic field B(z,t) present within the MOEMS sensor is significantly larger than the magnetic field component of the electromagnetic field present in the formation (e.g., greater by at least a factor of 10), such that the effect of the formation's magnetic field on the MOEMS sensor is negligible. This difference in magnitude is due to the fact that the electrical potential within the formation is measured across the distance between electrodes 120 (typically several meters), whereas the same electrical potential applied to induction coil 124 produces an electric current through the induction coil that is concentrated over the much smaller cross-sectional area and length of the induction coil (both less than a few centimeters), producing a much stronger magnetic field B(z,t).

A variation of the MOEMS sensor of FIG. 4B (similar to that of FIG. 3C) is shown in FIG. 4C in which the electrical potential V(t) applied to induction coil 124 is provided by an induction coil 122. The electrical potential is induced across induction coil 122 by the magnetic field component $B_1(z,t)$ of the electromagnetic field present in the surrounding formation. The determination of the electrical potential V(t) across induction coil 124 from the optical wavelength variations is achieved in the same manner as for the embodiment of FIG. 4B, and the magnetic field $B_1(z,t)$ around induction coil 122 is determined from the electrical potential V(t) in the same manner as for the embodiment of FIG. 3C. Once the magnetic field around induction coil 122 is known, the electric or magnetic properties being measured, such as electric resistivity, electric permittivity and/or magnetic permeability and corresponding composition of the surrounding formation can be derived using any of a wide variety of know techniques, given a known transmitted excitation signal.

It should be noted that the sensitivity of the disclosed MOEMS sensors enables the electrical potential sourced by either the formation or by the induction coils sensing the formation's electromagnetic field to be applied to at least some embodiments of the sensor without the use of amplifiers or any other active electrical component, greatly simplifying the design of the sensor system and thus increasing its reliability over systems that require active components.

In at least some illustrative embodiments, multiple sensors may be positioned along a given optical fiber. Each sensor may be of any of the sensor types shown in FIGS. 2A through 4C, and any combination of sensor types may be implemented. Time, frequency and/or wavelength multiplexing may be used to separate the measurements associated with each sensor. In FIG. 5A, for example, a light source 502 emits light in a continuous beam. A circulator 504 directs the light along fiber optic cable 505. The light travels along the cable 505, interacting with a series of sensors 500, before reflecting off the end of the cable and returning to circulator 504 via sensors 500. The circulator directs the reflected light to a light detector 508. The light detector 508 separates the measurements associated with different sensors 500 via frequency multiplexing. That is, each sensor 500 affects only a narrow wavelength band of the light beam, and each sensor is designed to affect a different wavelength band by slightly varying the size of the optical resonant cavities of each sensor 500.

In FIG. 5B, light source 502 emits light in short pulses. Each sensor 500 is coupled to the main optical fiber via a splitter 506. The splitters direct a small fraction of the light from the optical fiber to the sensor, e.g., 1% to 4%. The sensor 500 interacts with the light and reflects it back to the detector 508 via the splitter, the main fiber, and the circulator. Due to the different travel distances, each pulse of light from source 502 results in a sequence of return pulses, with the first pulse arriving from the nearest sensor 500, the second pulse arriving from the second nearest sensor, etc. This arrangement enables the detector to separate the sensor measurements on a time multiplexed basis.

The arrangements of FIGS. 5A and 5B are both reflective arrangements in which the light reflects from a fiber termination point. They can each be converted to a transmissive arrangement in which the termination point is replaced by a return fiber that communicates the light back to the surface. FIG. 5C shows an example of such an arrangement for the configuration of FIG. 5B. A return fiber is coupled to each of the sensors via a splitter to collect the light from the sensors 500 and direct it to a light detector 508.

Other arrangement variations also exist. For example, multiple sensors may be coupled in series on each branch of the FIG. 5B, 5C arrangements. A combination of time division, frequency division and wavelength division multiplexing could be used to separate the individual sensor measurements. In at least some frequency division multiplexing embodiments, each sensor measures variations of the electromagnetic fields at different frequencies, preferably by each sensor (e.g., each monitoring a different zone in a well) detecting field variations created by a local electromagnetic signal source, each source operating at a different frequency.

Because of the small size of the disclosed MOEMS sensors, even small to moderate mechanical vibrations present in the environment surrounding the sensors can potentially induce movement of the sensor's field sensitive layers, and thus interfere with the operation of the sensors. To reduce the effect of such vibrations, sensors can be combined such that mechanical vibrations at each sensor are out of phase from each other, but the fields being measured by each sensor are in phase with each other. Thus, summing the signals from each sensor cancels at least in part mechanical vibrations, but constructively adds the field signals.

FIG. 6A shows an illustrative example of such a vibration cancellation configuration using the sensor embodiment of FIG. 2A. The sensors are attached or at least positioned as near to each other and as close to the opposite orientation as is practical, such that they are subjected to substantially the same mechanical vibrations along the same axis. Thus, the vibrational components of the resulting wavelength variations produced by each sensor are out-of-phase with each other. The response to the electrical potential of the surrounding formation, with or without pre-bias, produces the same response for each sensor, Therefore, summing the two outputs cancels out the mechanical motion while improving the signal-to-noise ratio of the field signal measurements.

Figure 6C:
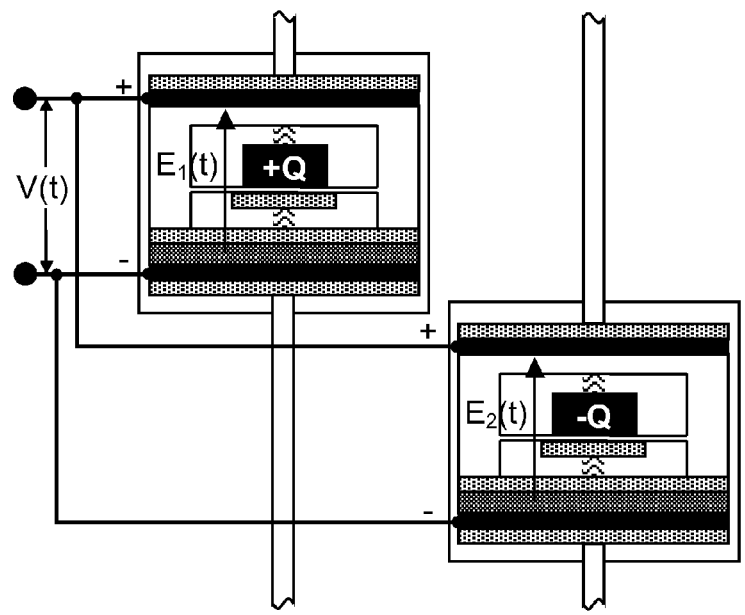

FIGS. 6B and 6C show illustrative examples of vibration cancellation configurations of the sensor embodiment of FIG. 3B. The example of FIG. 6B is configured with the electrical potential of the surrounding being applied to each sensor with opposing polarities, and each sensor having an isolated charge+Q with the same polarity and substantially the same magnitude. The resulting wavelength variations produced by the sensor are similar to those of the example of FIG. 6A and are processed in the same manner, except that in this case the signals are subtracted to achieve the desired cancellation. In the example of FIG. 6C, however, the formation's electrical potential is applied to each sensor with the same polarity, with each sensor having an isolated charge with substantially the same magnitude but opposite polarities +Q and −Q as shown. The signals in this embodiment are also processed in the same manner as the embodiment of FIG. 6B to achieve the desired mechanical vibration cancellation.

Figure 6D:
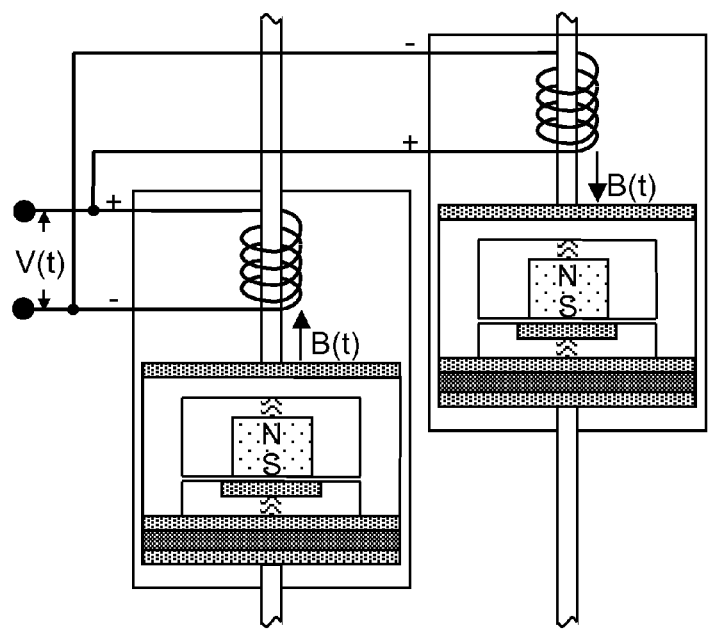
Figure 6E:
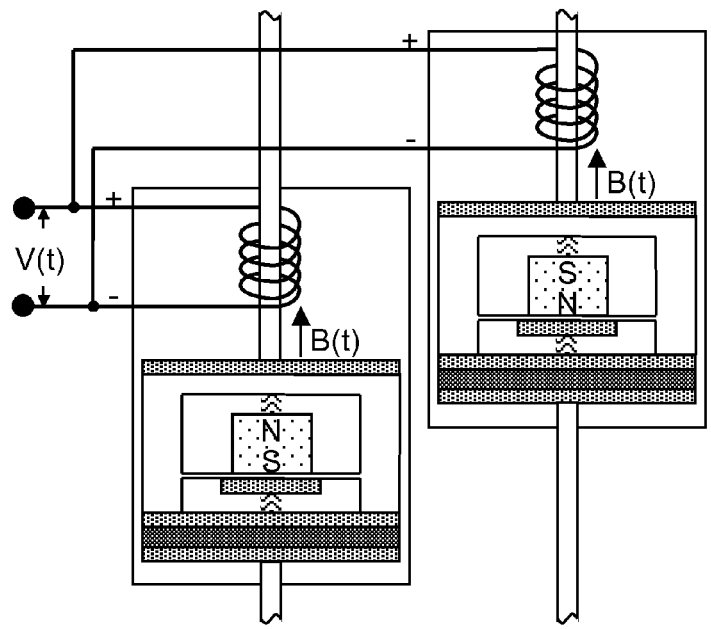

FIGS. 6D and 6E show embodiments similar to 6B and 6C but using the sensor embodiment of FIG. 4B. In the embodiment of FIG. 6D, the formation's electrical potential is applied to each sensor with opposing polarities to sensors that each has a polarized magnetic field sensitive layer with a North/South orientation along the translation axis of their respective field sensitive layers. The resulting magnetic fields around each induction coil are of opposing orientations, thus producing the out-of-phase field measurement components that enable the resulting wavelength variation signals to be processed to reduce and/or cancel the mechanical vibration components. In the embodiment of FIG. 6E, the formation's electrical potential is applied to each sensor with the same polarity to produce magnetic fields around each induction coil of the same polarity. However, each sensor has a polarized magnetic field sensitive layer with opposite polarities: one North/South and the other South/North, each along the translation axis of their respective field sensitive layers. This configuration also produces the out-of-phase field measurement components that enable the resulting wavelength variation signals from the sensors to be processed so as to reduce and/or cancel the mechanical vibration components.

It should be noted that although the vibration cancellations examples presented only show sensor embodiments that use electrodes, any of the disclosed sensors may be configured as shown for vibration cancellation. Also, although different types of sensors may be combined for vibration cancellation, the use of sensors of the same type is preferred.

As previously noted, the disclosed sensors and combinations of sensors are suitable for use within downhole tools and system used to acquire data regarding the formation surrounding a borehole, such as that surrounding an oil and gas well borehole. Such data may be acquired while drilling the borehole using LWD/MWD and wireline logging tools and systems, and/or afterwards once the well is completed and producing using permanently installed monitoring systems. FIG. 7 shows an example a wireline logging tool 714, suitable for use with the above-described sensors, being deployed down a borehole. The wireline logging tool 714 a sensing instrument sonde suspended by a cable 742 having conductors and optical fibers for transporting power to the tool, telemetry from the tool to the surface, and light to and from the above-described sensors. Wireline logging tool 714 is deployed from drilling platform 702, which supports a derrick 704 having a traveling block 706 through which cable 742 passes. Traveling block 706 suspends logging tool 714, which is lowered into the borehole through rotary table 712 and collects data as it passes through various formations 716.

A wireline logging tool 714 may have pads and/or centralizing springs to maintain the tool near the axis of the borehole as the tool is pulled uphole. A surface logging facility 744 collects measurements from the logging tool 714, and includes a surface computer system 745 for processing and storing the measurements gathered by the logging tool. The surface computer system 745 is configured to communicate with the logging tool during the logging process. The surface computer system 745 is preferably configured by software (e.g., in the form of non-volatile removable media 732) to process the logging tool measurements. Surface computer system 745 includes a processing subsystem 730, a display device 736 and user input devices 734 and 735 to enable a human operator to interact with the system software 732.

In at least some illustrative embodiments, the logging tool 714 includes one or more transmitters that each induces electromagnetic fields and/or electrical potentials within the formation surrounding the logging tool. These fields and/or electrical potentials may be induced though electrodes similar to those described above, or using coils or antennas. Such techniques for inducing electrical potentials and electromagnetic fields within a formation are well known in the art and are not discussed further. The transmitter(s) may be controlled by a downhole controller located within logging tool 714, by the surface computer system 745, or cooperatively controlled by both. The tool further measures the formation responses to the imposed fields employing MOEMS sensors such as those described herein. Data collection from these sensors, located within the logging tool 714, is synchronized with operation of the transmitter(s) so that the sampled data can be correlated to the transmission and so that calculations such as, for example, propagation delays and phase shifts can be calculated. Surface computer system 745 may process the sampled data, may share the processing with a remote computer system with which surface computer system 745 communicates, or may simply forward the sampled data with little or no processing to the remote computer system for processing. As previously noted, the frequencies of the signals fed to the transmitters can be apportioned so that different sensors along the same optical cable are monitoring signals of different time frequencies and can therefore be demultiplexed at the surface in the (electrical) frequency domain.

The disclosed sensors and combinations of sensors are also suitable for use with reservoir monitoring and management systems installed on completed wells, such as that shown in FIG. 8. The well includes a casing header 804 and casing 806, both secured into place within borehole 802 by cement 803. Blowout preventer (BOP) 808 couples to casing header 806 and production wellhead 810, which together seal in the well head and enable fluids to be extracted from the well in a safe and controlled manner. Production tubing 812 extends down into casing 806 and through packer 822, which operates to separate producing and non-producing zones within the well. Fluids flow into the well from the formation through perforations 825 and up the interior of production tubing 812 to the production wellhead 810 at the surface. A cable 828 is secured to casing 806 and in at least some illustrative embodiments includes one or more fiber optic cables. MOEMS sensors 826 such as those previously described are integrated into cable 828 to obtain electromagnetic field measurements and communicate these to a surface computer system 845. Cable 828 and sensors 826 are embedded within cement 803 and thus permanently installed as part of the completed well.

In at least some illustrative embodiments, surface computer system 845 communicates with a transmitter 830 that couples between casing 806 and a remote earth electrode 832 as shown in FIG. 8. Alternatively, transmitter 830 couples between an electrical conductor running along cable 828 and remote earth electrode 832. The casing or cable conductor thus each acts as a source electrode for current flow into the formations surrounding the borehole 802. The magnitude and distribution of the current flow will vary in accordance with the source voltage and the formation's resistivity, permittivity and/or permeability profile. The EM field measurements by MOEMS sensors 826 will thus be representative of the resistivity, permittivity and/or permeability profile. Techniques for transmitting such excitation signals into a formation and monitoring the resulting electromagnetic field around a completed well are described in more detailed in commonly owned U.S. patent application Ser. No. 13/736,487, titled "Fiberoptic Systems and Methods for Subsurface EM Field Monitoring" and filed Jan. 8, 2013 by L. E. San Martin, E. Samson and B. Donderici, which is hereby incorporated herein by reference.

Surface computer system 845 operates to control electromagnetic field generation, generation of the light beams transmitted down the optical fibers within cable 828 to MOEMS sensors 826, and processing of the wavelength variations present in the light beams returned to the surface through cable 828. In at least some illustrative embodiments, surface computer system 845 is similar to surface computer system 745 of FIG. 7 and processes signals representing the wavelength variations of the light beams received from the various MOEMS sensors. Surface computer system 845 may perform all of the processing, may share the processing with a remote computer system with which surface computer system 845 communicates, or may simply forward the data with little or no processing to the remote computer system for processing.

Figure 9:
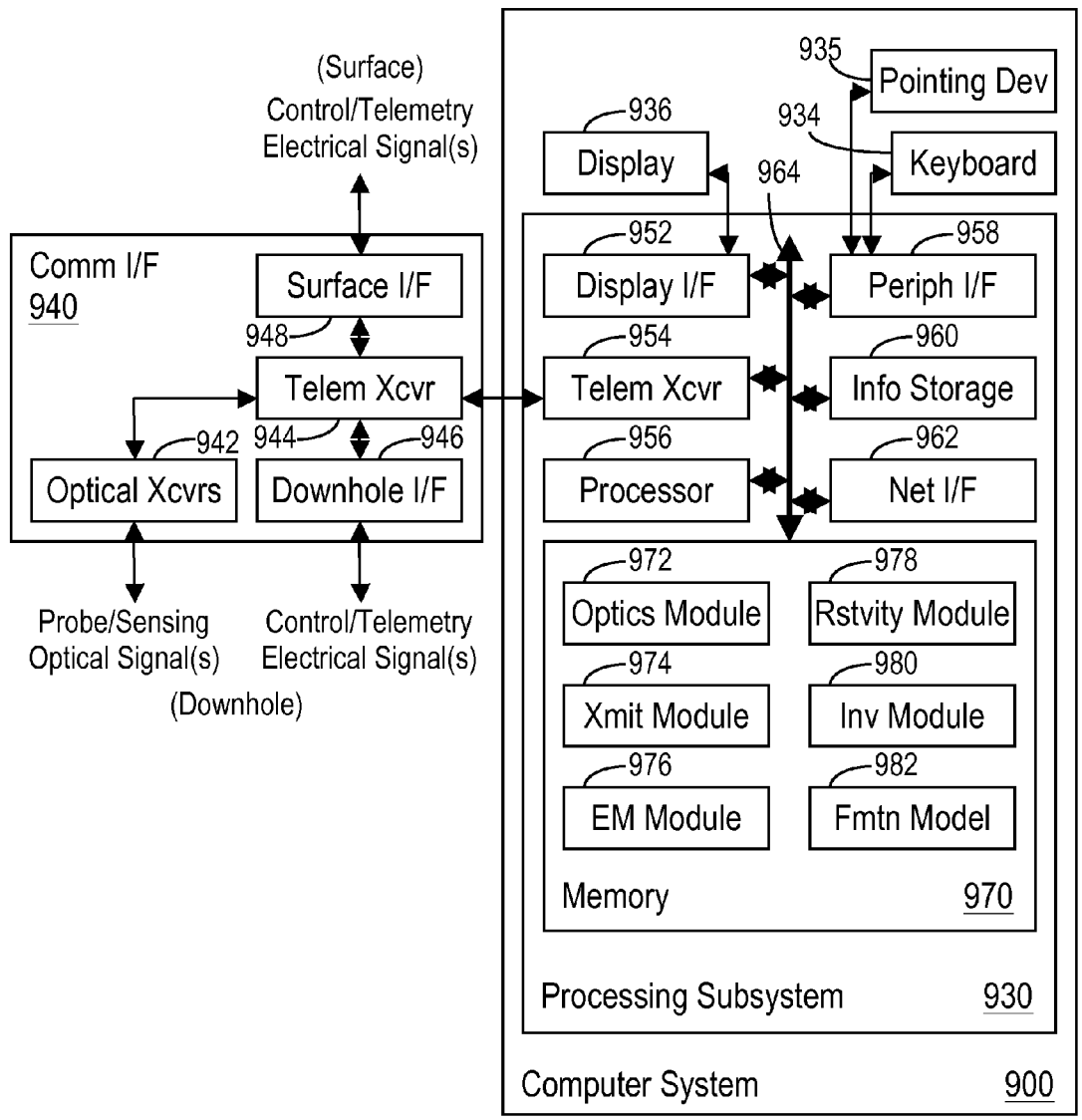
FIG. 9 shows an illustrative computer system for controlling and processing optical signals propagated through the disclosed MOEMS sensors.

FIG. 9 shows an illustrative embodiment of a computer system 900 suitable for use as either surface computer system 745 of FIG. 7 or surface computer system 845 of FIG. 8. FIG. 9 shows both hardware and software components of computer system 900, which in at least some illustrative embodiments implement at least part of the method 1000 shown in FIG. 10. A user may interact with computer system 900 via keyboard 934 and pointing device 935 (e.g., a mouse) to send commands and configuration data to one or more downhole devices (e.g., logging tool 714 of FIG. 7) as well as surface devices (e.g., transmitter 830 of FIG. 8) that are part of the logging or reservoir monitoring systems.

Located within processing subsystem 930 of computer system 900 is a display interface 952, a telemetry transceiver 954, a processor 956, a peripheral interface 958, an information storage device 960, a network interface 962 and a memory 970. Bus 964 couples each of these elements to each other and transports their communications. Telemetry transceiver 954 enables the processing subsystem 930 to communicate with the downhole and/or surface devices (either directly or indirectly), and network interface 962 enables communications with other systems (e.g., a central data processing facility via the Internet). In accordance with user input received via peripheral interface 958 and program instructions from memory 970 and/or information storage device 960, processor 956 processes telemetry information received via telemetry transceiver 954 to construct formation resistivity, permittivity and/or permeability logs in accordance with the disclosed methods, and display them to the user.

In at least some illustrative embodiments, computer system 900 communicates with communications interface 940, which acts as a distribution/concentration point for control and telemetry to and from the various downhole and/or surface devices. In the example of FIG. 9, communications interface 940 includes a telemetry interface 944 (similar to telemetry interface 954) that couples to surface interface 948 (providing an interface to surface devices), downhole interface 946 (providing an interface to downhole devices other than the MOEMS sensors), and optical transceivers 942 (coupled to the disclosed MOEMS sensors). Optical transceivers 942 include one or more optical transmitters (e.g., LED lasers) that generate the light beam(s) transmitted to the downhole MOEMS sensor(s); one or more optical receivers that detect the wavelength modulated light beam(s) received from the downhole MOEMS sensor(s) and convert the modulated light beam(s) to electrical signals; and (optionally) an optical circulator to separate the transmitted and received light beams for embodiments that use a single fiber for both transmitted and received light beams to and from the sensor(s). In at least some illustrative embodiments, optical transceivers 942 also includes one or more analog-to-digital (A/D) converters that convert the analog electrical signals produced by the optical receivers to digital data suitable for transmission by telemetry transceiver 944 to computer system 900. In other illustrative embodiments, the analog signals produced by the optical receivers are coupled to an A/D converter installed within processing system 930 that couples to bus 964.

Figure 10:
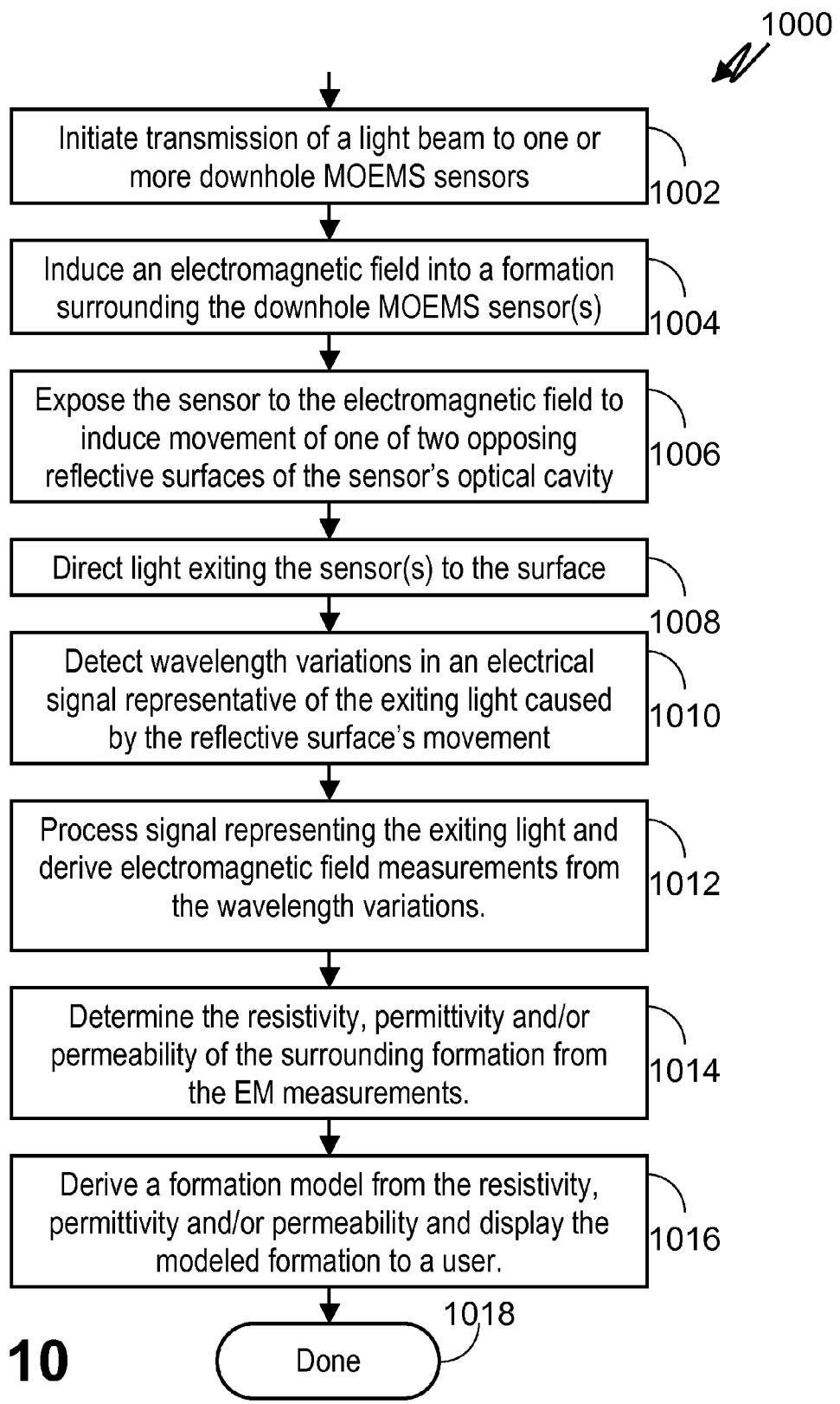
FIG. 10 shows an illustrative method for operating the disclosed MOEMS sensors to determine the resistivity, permittivity and/or permeability of a surrounding formation.

FIG. 10 shows an illustrative method 1000, at least part of which may be implemented by software executing on computer system 900. It should be noted that although the embodiment shown in FIG. 10 shows the various software modules executing on computer system 900, which is located on the surface near the borehole, in other illustrative embodiments some or all of the modules may execute on other computer systems that may be located downhole or at a remote location, or may execute on two or more systems in a distributed manner. Referring now to both FIGS. 9 and 10, transmission of a light beam to one or more downhole MOEMS sensors is initiated (block 1002; triggered by optics software module 972), and a transmitter is commanded to transmit and induce an electromagnetic signal into a formation surrounding the MOEMS sensor(s) (block 1004; transmit module 974). The transmission exposes the MOEMS sensors(s) to the resulting transmitted electromagnetic field, causing one of the partially reflective surfaces within the sensor's to move and produce wavelength variations in the light exiting the sensor(s) (block 1006). The light exiting the MOEMS sensor(s) is directed to the surface by one or more optical fibers (block 1008), where the modulated light is converted into digital electrical signals by optical transceivers 942 and forwarded to computer system 900 for processing.

The digital data representing the received modulated light is processed by software executing on computer system 900, which detects the wavelength variations in the signal (block 1010; electromagnetics module 976) and estimates the electromagnetic field strength using the applicable calculations (depending on the sensor type) as previously described (block 1012; electromagnetics module 976). Once the electromagnetic field has been estimated, the resistivity, permittivity and/or permeability is calculated (block 1014; resistivity module 978) and formation model 982 is derived from the calculated resistivity, permittivity and/or permeability (block 1016; inversion module 980), ending the method (block 1018).

Numerous other modifications, equivalents, and alternatives, will become apparent to those skilled in the art once the above disclosure is fully appreciated. For example, although not shown or described in detail, the disclosed sensors may be used with LWD and MWD systems that utilized drillstrings that provide for the use of optical fibers over at least part of the length of the drillstring. Also, although the light beam is shown passing through the center of the sensor, the light beam may be directed through other parts of the sensor. Additionally, although LED lasers are given as an example of a light beam source suitable for use with the disclosed sensors, many other light sources may also be suitable, and all such light sources are within the scope of the present disclosure. Further, although the embodiments presented show 4 beams used to support the field sensitive layer, as few as a single beam (sometimes referred to as a cantilever configuration) or more than four beams may be used. For example, the illustrative embodiment of FIGS. 4A through 4C may use 8 beams, four at the bottom of polarized magnetic element 102 and four at the top, to reduce and/or eliminate any rotation of element 102. It is intended that the following claims be interpreted to embrace all such modifications, equivalents, and alternatives where applicable.

What is claimed is:

1. A downhole micro-opto-electro-mechanical system (MOEMS) electromagnetic field sensor that includes:
a first surface that is at least partially reflective;
a second surface that is at least partially reflective, said second surface suspended by one or more flexible members to define an optical cavity having a variable distance between the first and second surfaces;
a first conductive layer attached to the first surface; and
a second conductive layer attached to the second surface, the first and second conductive layers having an electrical potential proportional to an electromagnetic field within a formation surrounding the sensor, the electrical potential producing an electric field that displaces the second surface to alter the variable distance and cause a spectrum variation in light exiting the sensor.

2. The sensor of claim 1, further comprising:
a first electrode positioned to contact the formation and electrically coupled to the first conductive layer; and
a second electrode positioned to contact the formation at a different location from the first electrode and electrically coupled to the second conductive layer;
wherein the electrical potential, present in the formation and produced by the electromagnetic field, is applied across the first and second conductive layers through the first and second electrodes.

3. The sensor of claim 1, further comprising an induction coil coupled to the first and second conductive layers, wherein the electrical potential is produced across the induction coil by the electromagnetic field.

4. The sensor of claim 1, further comprising an electrically conductive enclosure that surrounds and shields the optical cavity from the electromagnetic field.

5. The sensor of claim 1, further comprising an optical path that permits the light to enter the sensor through a first side of the sensor and to exit the sensor through a second side of the sensor opposite the first side.

6. The sensor of claim 1, further comprising an optical path that permits the light to enter and exit the sensor through a single side of the sensor.

7. A downhole electromagnetic field measurement system that comprises:
a first downhole micro-opto-electro-mechanical system (MOEMS) electromagnetic field sensor that includes:
a first surface that is at least partially reflective;
a second surface that is at least partially reflective, said second surface suspended by one or more flexible members to define an optical cavity having a variable distance between the first and second surfaces;
a first conductive layer attached to the first surface; and
a second conductive layer attached to the second surface, the first and second conductive layers having an electrical potential proportional to an electromagnetic field within a formation surrounding the first sensor, the electrical potential producing an electric field that displaces the second surface to alter the variable distance and cause a spectrum variation in light exiting the first sensor;
a transmitter that induces said electromagnetic field; and
a computer that processes optical signals received from the first sensor to measure said electromagnetic field and to derive a formation property based at least in part on said electromagnetic field.

8. The system of claim 7, the first sensor further comprising:
a first electrode positioned to contact the formation and electrically coupled to the first conductive layer; and
a second electrode positioned to contact the formation at a different location from the first electrode and electrically coupled to the second conductive layer;
wherein the electrical potential, present in the formation and produced by the electromagnetic field, is applied across the first and second conductive layers through the first and second electrodes.

9. The system of claim 7, the first sensor further comprising an induction coil coupled to the first and second conductive layers, wherein the electrical potential is produced across the induction coil by the time-varying electromagnetic field picked-up by the induction coil.

10. The system of claim 7, the first sensor further comprising an electrically conductive enclosure that surrounds and shields the optical cavity from the electromagnetic field.

11. The system of claim 7, further comprising a first optical waveguide and a second optical waveguide that couple the computer to the first sensor,
wherein the first sensor further comprise an optical path that permits the light to enter the first sensor through a first side of the first sensor and to exit the first sensor through a second side of the first sensor opposite the first side; and
wherein the light enters the sensor from the first optical waveguide and exits the sensor into the second optical waveguide.

12. The system of claim 7, further comprising an optical waveguide that couples the computer to the first sensor,
wherein the first sensor further comprises an optical path that permits the light to enter and exit the first sensor through a single side of the first sensor; and
wherein the light both enters and exits the sensor through the optical waveguide.

13. The system of claim 7, further comprising a second sensor,
wherein the electrical potential is applied to the first and second conductive layers of the second sensor; and
wherein the orientation of the suspended surface relative to the first reflective surface in the second sensor is a mirror image to the orientation between the corresponding surfaces of the first sensor; and
wherein the computer combines a signal representative of the spectrum variation from the first sensor with the signal representative of the spectrum variation from the second sensor and produces a signal with an at least partially cancelled vibrational noise component.

14. The system of claim 7, wherein the first sensor is embedded within cement surrounding the casing of a completed well.

15. The system of claim 7, further comprising a tool selected from the group consisting of a wireline well logging tool, a logging while drilling tool and a measurement while drilling tool, wherein the tool comprises the first sensor.

16. A method for measuring an electromagnetic field using one or more downhole micro-opto-electro-mechanical system (MOEMS) electromagnetic field sensor, the method including:
inducing an electromagnetic field into a formation surrounding a borehole;
applying an electrical potential produced by the electromagnetic field across two conductive layers, each conductive layer attached to one of two surfaces that are at least partially reflective and that define an optical cavity within a first sensor having a variable distance between the two surfaces;
directing to the borehole surface light exiting the first sensor;

detecting a spectrum variation in the light exiting the first sensor, the applied electrical potential causing a displacement of one of the two surfaces to alter the variable distance and cause the spectrum variation; and processing a first signal representing the detected spectrum variation to measure said electromagnetic field and to derive a formation property based at least in part on said electromagnetic field.

17. The method of claim 16, wherein the formation property comprises a resistivity, a permittivity or a permeability of the formation.

18. The method of claim 16, further comprising providing the applied electrical potential through two electrodes contacting the formation that are each electrically coupled to one of the two conductive layers.

19. The method of claim 16, further comprising providing the applied electrical potential from an induction coil coupled to each of the two conductive layers, wherein the electromagnetic field produces the applied electrical potential across the induction coil.

20. The method of claim 16, further comprising:
processing a second signal representative of light exiting a second sensor, wherein the electrical potential is applied to the second sensor with a polarity opposite that applied to the first sensor; and combining the first processed signals with an inversion of the second processed signals to produce a spectrum variation signal with an at least partially cancelled vibrational noise component.

* * * * *